United States Patent [19]
Arakawa et al.

[11] Patent Number: 5,670,881
[45] Date of Patent: Sep. 23, 1997

[54] DISCRETE STEP REMOTELY ADJUSTABLE MATCHING CIRCUIT FOR MRI RF COILS

[75] Inventors: Mitsuaki Arakawa, Hillsborough; John G. van Heteren, Foster City; Joseph W. Carlson, Kensington; Leon Kaufman, San Francisco; Einar Tapio, Mountain View, all of Calif.

[73] Assignee: Toshiba America, Inc., Tustin, Calif.

[21] Appl. No.: 599,071

[22] Filed: Feb. 9, 1996

[51] Int. Cl.⁶ .............................. G01R 33/34; H01P 5/08; A61B 5/055
[52] U.S. Cl. ...................... 324/322; 333/17.3; 128/653.5
[58] Field of Search .................. 324/300, 307, 324/318, 322; 333/17.3, 32; 334/55; 128/653.5

[56] References Cited

U.S. PATENT DOCUMENTS

| | | | |
|---|---|---|---|
| 3,906,405 | 9/1975 | Kommrusch | 333/17.3 |
| 4,486,722 | 12/1984 | Landt | 333/17.3 |
| 4,827,219 | 5/1989 | Harrison. | |
| 4,890,063 | 12/1989 | Haragashira. | |
| 5,221,901 | 6/1993 | Decke et al. | 324/318 |
| 5,276,411 | 1/1994 | Woodin, Jr. et al. | 333/22 R |
| 5,463,285 | 10/1995 | El-Aamamsy | 315/248 |
| 5,565,779 | 10/1996 | Arakawa et al. | 324/318 |

FOREIGN PATENT DOCUMENTS

| | | |
|---|---|---|
| 50049615 | 7/1993 | Japan. |
| WO 96/27803 | 12/1996 | WIPO. |

Primary Examiner—Sandra L. O'Shea
Assistant Examiner—Roger C. Phillips
Attorney, Agent, or Firm—Nixon & Vanderhye P.C.

[57] ABSTRACT

An RF coil tuning circuit is disclosed in which two banks of parallel capacitive branches are provided. Each capacitive branch includes a fixed value capacitor, a relay and a PIN diode connected in series. An impedance of the tuning circuit is adjusted to the optimum VSWR=1 condition by first switching the eight PIN diodes to learn which open/closed condition applies the fixed value capacitors in the optimum combination. Then, the PIN diodes are all closed and the optimum combination is applied using the open/closed states of the relays.

16 Claims, 4 Drawing Sheets

REMOTE TUNING CIRCUIT

*PRIOR ART*

5,670,881

1

DISCRETE STEP REMOTELY ADJUSTABLE MATCHING CIRCUIT FOR MRI RF COILS

FIELD OF THE INVENTION

This invention relates to RF coils for nuclear magnetic resonance systems, and more particularly to a matching circuit for those RF coils.

BACKGROUND OF THE INVENTION

As is well-known in the field of magnetic resonance imaging, an RF transmitter coil is used to excite selected nuclei of an imaged body into a resonance condition. When the RF transmitter is then switched off, the nuclei relax back onto alignment with a static magnetic field created in the imaging volume. As the nuclei relax, they emit an RF signal that can be detected by an RF receiver coil. The RF transmitter coil (which transmits high power RF signals) generally surrounds the imaging volume and the RF receiver coil (which receives low power RF signals) ideally closely surrounds the particular body part being imaged. In some instances, the RF receiver coil and RF transmitter coil can be the same (with a proper transceiver switching device).

As shown in FIG. 1, the RF transmit ($T_x$) and receive ($R_x$) coils are typically located in a RF shielded room. The RF coils can be used in any of the several known types of MRI magnet structures, such as a cylindrical MRI system or a four-post MRI system. Also in the shielded room are the static magnet, the gradient coils, appropriate housings, and a sliding bed.

The $T_x$ and $R_x$ RF coils are electrically connected to, respectively, a transmitter and a receiver through respective tuning circuits. The tuning circuits for the $R_x$ coil can be a low voltage (up to 30V), low current varactor diode-based tuning circuit right on the $R_x$ coil structure. The cost of having a tuning circuit for the $T_x$ coil that is right on the coil or connected to the coil by a transmission line is high. Instead, the $T_x$ coil is sometimes fix-tuned.

As is known in the art, the tuning operation is designed to ideally match the impedance of the RF coil to a voltage standing wave ratio (VSWR) of 1. When the VSWR is 1, no power is reflected (lost) on the transmission line, resulting in good transmission efficiency.

In FIG. 2, the tuning adjustments are made remotely from the $T_x$ or $R_x$ coil by the tuning circuit 20. This circuit loosely corresponds to a remote tuning circuit described in U.S. Pat. No. 4,827,219, filed Jan. 7, 1988. The tuning circuit includes serial capacitors C1–C3, parallel indicators L1–L2 and parallel variable capacitors C4–C5. In FIG. 2, the tuning is accomplished by varying the capacitors C4–C5 via step motors 22 and 24. In commercial tuning circuits (such as those sold under the name FlexArt), like that shown in FIG. 2, each step motor (22 or 24) offers approximately 300–600 possible step values for its respective variable capacitors (C4 or C5), resulting in at least 90,000 different "tuning" combinations available to the MRI technician.

The 90,000 tuning combinations make the existence of at least one combination that closely matches the RF coil to a VSWR of approximately 1, a good probability. On the other hand, if scanning through the 90,000 combinations takes too much time, the effort may not be worth the result.

In addition, the FIG. 2 tuning circuit disadvantageously includes expensive step motors to adjust the variable capacitors C4–C5. Those variable capacitors are expensive, high voltage for example, 1,000 volts rms components that can endure the high voltages experienced during a RF transmission.

2

SUMMARY OF THE INVENTION

The present invention provides an improved timing circuit that can more rapidly converge the circuit into "tune" and does so with less expensive components. To do this, the high voltage variable capacitors are replaced with less expensive fixed value capacitors arranged in parallel banks. Each bank can have, for example, four fixed value capacitors arranged in parallel. The fixed value capacitors are each serially connected to a corresponding selector circuit (a relay and a PIN diode) that replaces the expensive step motors.

The PIN diodes and relays are controlled by a switch controller. When both the relay and PIN diode corresponding to a particular fixed value capacitor are shorted, the particular capacitor controlled by the relay and diode contributes to the timing impedance. Otherwise, it does not. As is more fully described below, the PIN diodes and relays can be advantageously used to find an optimum combination of capacitors to tune the RF coil.

In an embodiment in which each bank contains four capacitors, giving each bank 16 discrete capacitor values depending on which of the four capacitors are connected, the reactance value for each "step" (that is, when a capacitor is added or removed as an element contributing to the overall reactance of the tuning circuit) may not provide an exact optimum VSWR condition. The four capacitor per bank embodiment is nevertheless satisfactory, especially when combined with a finer 180° RF flip angle adjustment to compensate for reflected or lost RF power.

BRIEF DESCRIPTION OF THE DRAWINGS

The purpose and advantages gained by the present invention will be understood by careful study of the following detailed description of the presently preferred embodiment with particular reference to the accompanying drawings.

DETAILED DESCRIPTION OF THE PRESENTLY PREFERRED EMBODIMENT

Figure 1:
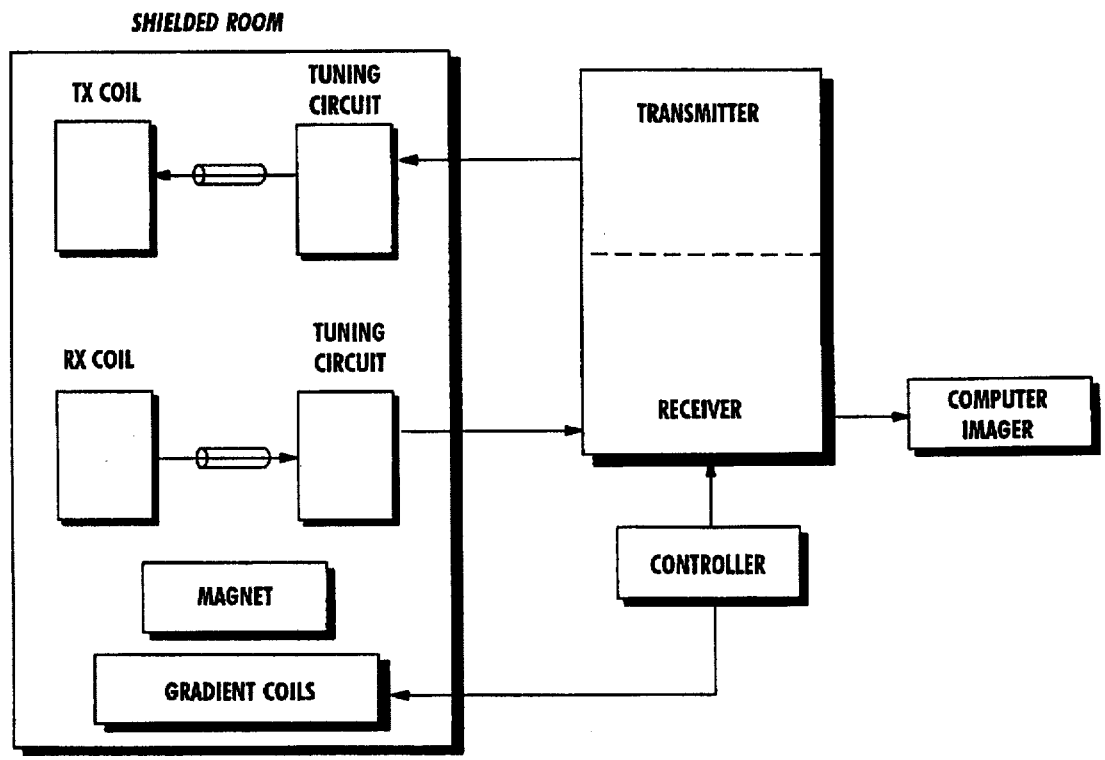
FIG. 1 is a block diagram of a generic MRI system.
Figure 2:
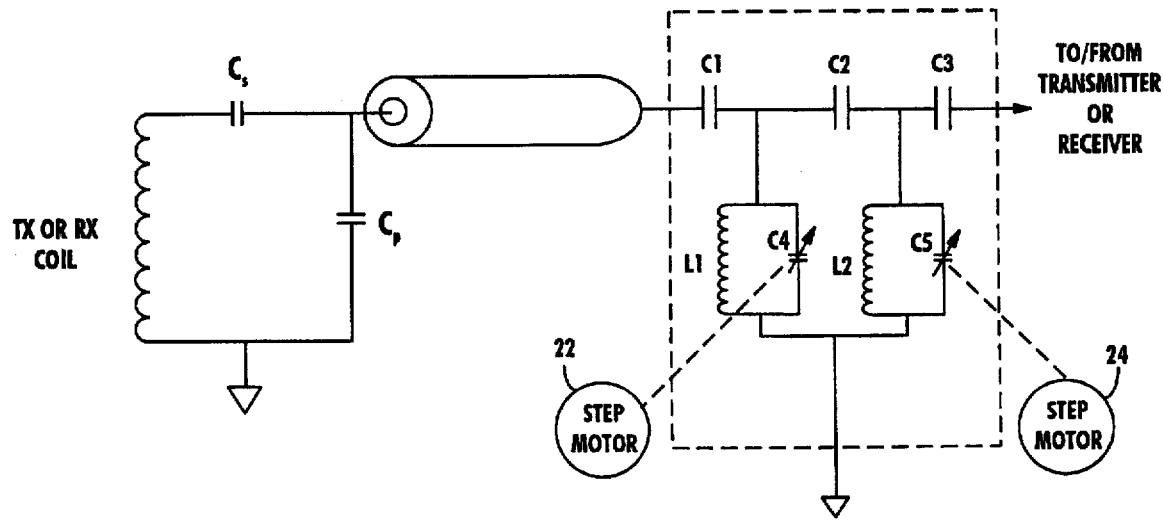
FIG. 2 is a schematic diagram of a prior art tuning circuit.
Figure 3:
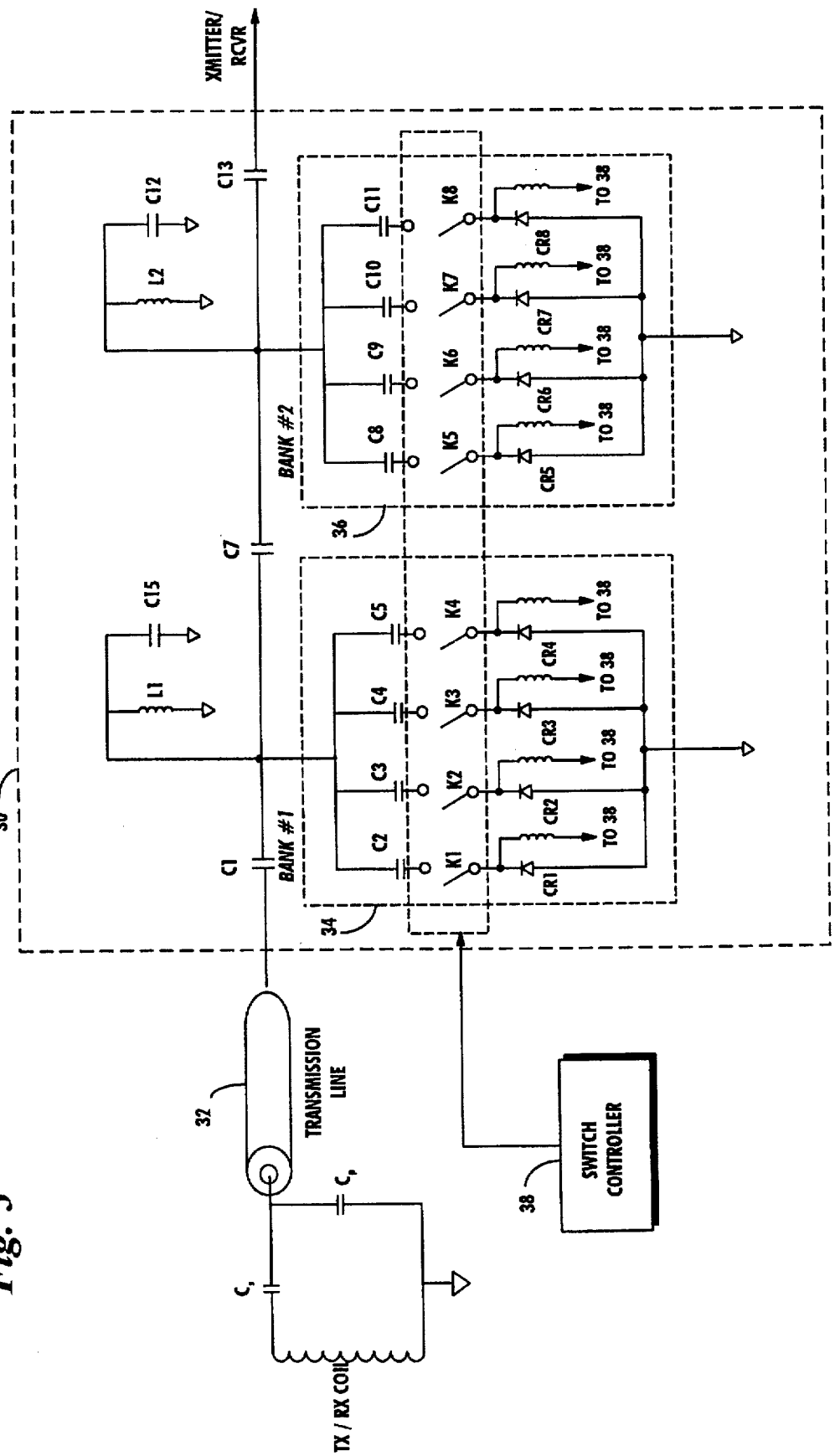
FIG. 3 is a schematic diagram of a tuning circuit according to one example embodiment of the present invention.

In FIG. 3, an example embodiment of the present invention is illustrated. The transmission or reception coil is shown with the traditional series capacitance $C_s$ and parallel capacitance $C_p$ that exist on the transmission or receiving coil board together with the coil itself. The coil board is connected by a transmission line 32 to a remote tuning circuit 30. The remote tuning circuit 30 includes three series capacitances C1, C7, and C13 connected in series with the transmission line 32. In between the series capacitance C1 and C7, a capacitor bank 34 is connected in parallel with an inductance L1 and an offset capacitance C15. In between the series capacitors C7 and C13, a second bank 36 of capacitors is connected in parallel with a second inductance L2 and a second offset capacitance C12. The opposite end of capacitor C13 connects via transmission line to the transmitter or receiver, as shown in FIG. 1.

In the example shown on FIG. 3, the capacitor banks 34 and 36 each include four parallel capacitive branches. The banks 34 and 36 can have any number more or less than four depending on the level of complexity and the degree of accuracy/tunability desired. Four branches in each of two banks, for example, provides eight bit tuning. More branches (or more banks) would provide a higher number of possible tuning combinations but also increases the tuning complexity and timing. Each capacitive branch includes a serial connection of a fixed value capacitor, a relay switch, and a PIN diode. The four discrete capacitors of the four capacitive branches of a particular bank have different values, such as, 20, 40, 80, and 160 picoFarads. The present invention is not limited, however, to those or any other specific capacitor values, number of capacitive branches, or arrangement of the capacitive branches. The relays K1–K8 and the PIN diode biasing are controlled by a switch controller 38.

As those in the art will understand, when the PIN diode and relay of a particular capacitive branch are in their ON state, the capacitors C2–C5 and C8–C11 on that particular capacitive branch will be connected in parallel with the respective inductor (L1 or L2) and the respective offset capacitor (C15 or C12). For bank 34, the total capacitance in parallel with the inductor L1 will be the sum of the capacitor values C2–C5 which are located in capacitive branches having both the relay K1–K4 and the PIN diode CR1–CR4 in their ON states. Similarly, the capacitance of the bank 36 will be the sum of the capacitor values C8–C11 which are located in capacitive branches having both the relay K5–K8 and the PIN diode CR5–CR8 in their ON states. Since the eight relays K1–K8 and the eight PIN diodes CR1–CR8 can be controlled by the controller 38 to vary the capacitance in the respective banks 34 and 36, the remote tuning circuit 30 offers 8 bit tuning (or 256 combinations) to achieve the closest VSWR=1 match available.

Figure 4:
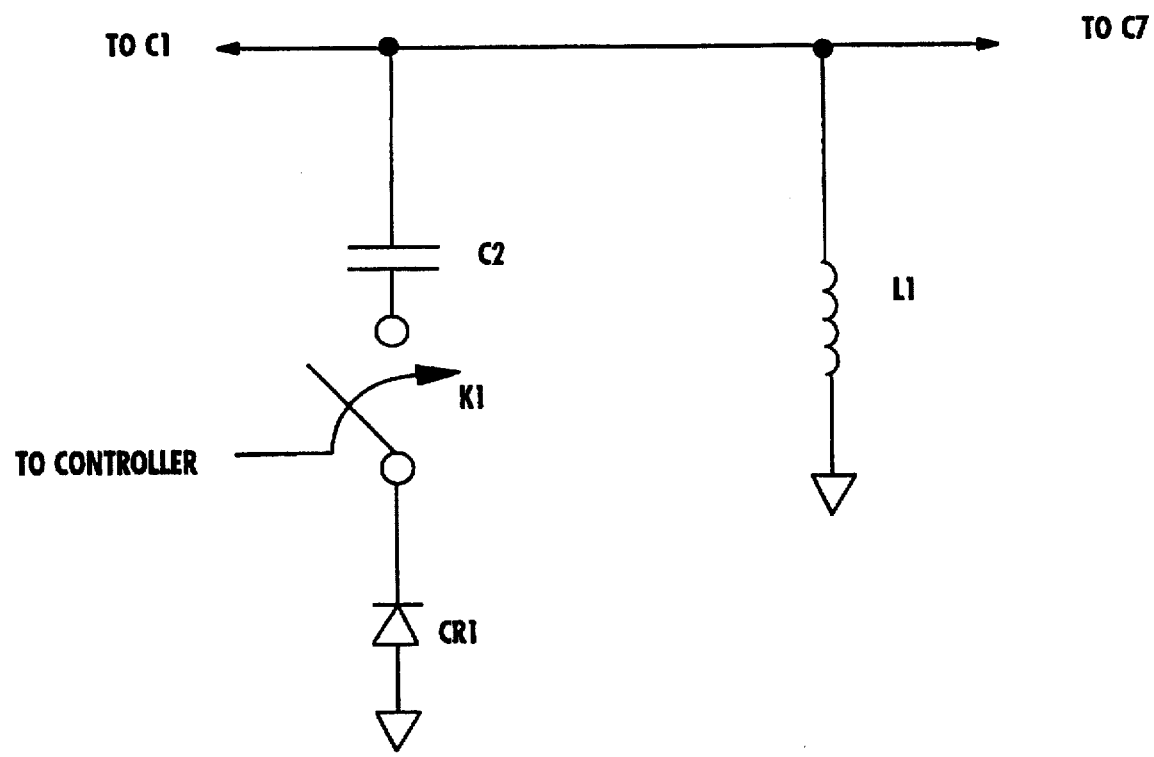
FIG. 4 is a schematic diagram of a capacitive branch according to one example embodiment of the present invention.

The combination of the relays K1–K8 with the PIN diodes CR1–CR8 is particularly advantageous. These advantages are described with reference to the exemplary capacitive branch shown in FIG. 4. As previously described, the capacitor C2 shown on FIG. 4 is a fixed value capacitor that, when connected in parallel with the inductor L1, will contribute to the tuning impedance of the remote tuning circuit 30 to match the coil $T_x/R_x$ to the transmitter/receiver. The relay K1 has two pertinent electrical characteristics:

1) It does not require a high DC voltage to maintain its "open" state.

2) It has a slow "open to close" response time (on the order of 0.01 to 0.10 seconds); and In contrast, the PIN diode CR1 has the following two pertinent characteristics:

1) It has a very fast response time (on the order of 10 to 100 microseconds); and 2) It requires 500 to up to 1,600 volts DC or more to maintain its open state during a high RF power transmission.

By connecting the relay K1 and the PIN diode CR1 in series, the present invention takes advantage of both favorable characteristics (#1 in each of the above two paragraphs) while minimizing the effect of the unfavorable characteristics (#2 in each of the above two paragraphs). For example, if in FIG. 4, only relay K1 (without PIN diode CR1) was connected to the capacitor, the switch controller could not "test" the effect of the capacitance C2 except by closing relay K1 (0.01 to 0.10 seconds), testing, and then reopening relay K1 (another 0.01 to 0.10 seconds). This process is relatively time-consuming, especially since the controller must switch through 256 combinations to "test" all of the possibilities for the best match. This process could thus require: (256 combinations)×(0.01–0.10 seconds)=2.56 to 25.6 seconds, just for the switching time itself.

In addition, the relays (which are electromechanical devices) have a relatively short life compared to semiconductor switches. Thus, for example, a relay rated at 1 million cycles that performs ten $T_x$ coil tunings per day would reach 1 million cycles in 391 days of operation if the relay alone is used for tuning.

The process can be shortened if the capacitor C2 is connected only to the PIN diode CR1 (without relay K1). Then, each PIN diode switching could occur in 10 to 100 microseconds. Unfortunately, if the best match requires C2 to be decoupled from the indicator L1 for tuning, the PIN diode CR1 must be held in its OFF state during high powered $T_x$ coil transmission. During this transmission, 500 to up to 1,600 volts DC must be applied to the PIN diode to hold it open. Thus, while the PIN diodes are fast, they require high DC voltages during RF transmission.

According to the present invention, the relays K1–K8 and diodes CR1–CR8 are used together to get good switching speed without high voltage requirements. When timing and matching a "fixed" tuned transmission coil, all of the relays K1–K8 are initially closed (electrically shorted) so the PIN diodes CR1–CR8 can be used as the ON/OFF switches to test the capacitive branches for the best match. Since the response time of these PIN diodes is very quick as compared to the relays K1–K8, the controller 38 can quickly find an optimal combination of capacitors C2–C5 and C8–C11 to match the $T_x/R_x$ coil to the transmitter receiver. Indeed, the maximum duration that the switch controller would require to find the optimal combination of capacitors would be 256 times the PIN diode response time (ignoring other external factors). Of course, the 256 possibilities can be reduced by using time saving algorithms, such as are described in U.S. Pat. No. 5,483,158, in the context of motorized variable capacitor tuning circuits.

Once the optimum combination of capacitors (C2–C5 and C8–C11) is determined, the combination is memorized and the PIN diodes are all forward biased to make all of the PIN diodes closed (electrically shorted). Then, the controller sends the memorized combination of states to the relays K1–K8 to apply the proper combination of capacitances C1–C8 for matching. The MRI scan then begins. Since the relays require a low voltage (normally 5 to 28 V DC depending on relay type used) to remain open during RF transmission and the PIN diodes (which could require high DC voltage to stay open) are all closed, high DC voltages, which are potentially dangerous and expensive, are avoided.

Suppose, for example, for a particular $T_x/R_x$ coil shown in FIG. 3, the optimum tuning condition is for capacitors C3 and C4 to be connected in parallel in capacitor bank 1 and capacitor C10 alone to be connected in capacitor bank 2. Initially, of course, the computer does not recognize this optimum combination and so its "matching" query begins. The computer could identify the optimum condition by switching the relays K1–K8 through the 256 possible combinations in order to discover the C3/C4 and C10 condition, but this would take a considerable time. Consequently, the switch control 38 shorts all of the relays K1–K8, then switches the diodes CR1–CR8 through the 256 combinations while testing for the lowest VSWR. The computer can do this very rapidly since the response time for the respective diodes is relatively quick. When the computer recognizes that the parallel combination of C3 and C4 in bank #1 and the lone capacitor C10 in bank #2 provides the lowest VSWR condition (VSWR approx. 1), the computer closes all of the PIN diodes CR1–CR8 (thus not forcing the computer to hold them "open" during the high RF power transmission) and instead connects C3 and C4 to L1 by holding only relays K2 and K3 of bank #1 closed and connects C10 to L2 by holding only relay K7 of bank #2 closed. The RF power transmission then begins. Since the relays do not require high DC voltage to remain in their open condition, the remote tuning circuit 30 avoids the high DC voltages during the RF power transmission. At the same time, however, the fast PIN diodes CR1–CR8 can be utilized instead of the relays K1–K8 in order to find the optimum matching condition.

Although the present invention is not limited to any particular capacitive or inductive values, number of capacitors per bank, weighting, or capacitor value step size, the values appropriate to a particular coil can be determined using traditional methods. Although the present invention is not limited to any particular capacitive or inductive values, the values appropriate to a particular VSWR coverage at a particular frequency can be determined by numerically analyzing the circuit impedance and reflection. These capacitive and inductive values are independent of particular RF coil type or the RF coil matching circuit inductance and capacitance values. What is of concern is the output impedance or reflection coefficient of the RF coil matching circuit. One method of determining these impedance values can be found in van Hereten et al, U.S. Pat. No. 5,483,158 (and in particular in the discussion regarding equations 2–9 therein) which is incorporated herein in its entirety by reference.

Figure 5:
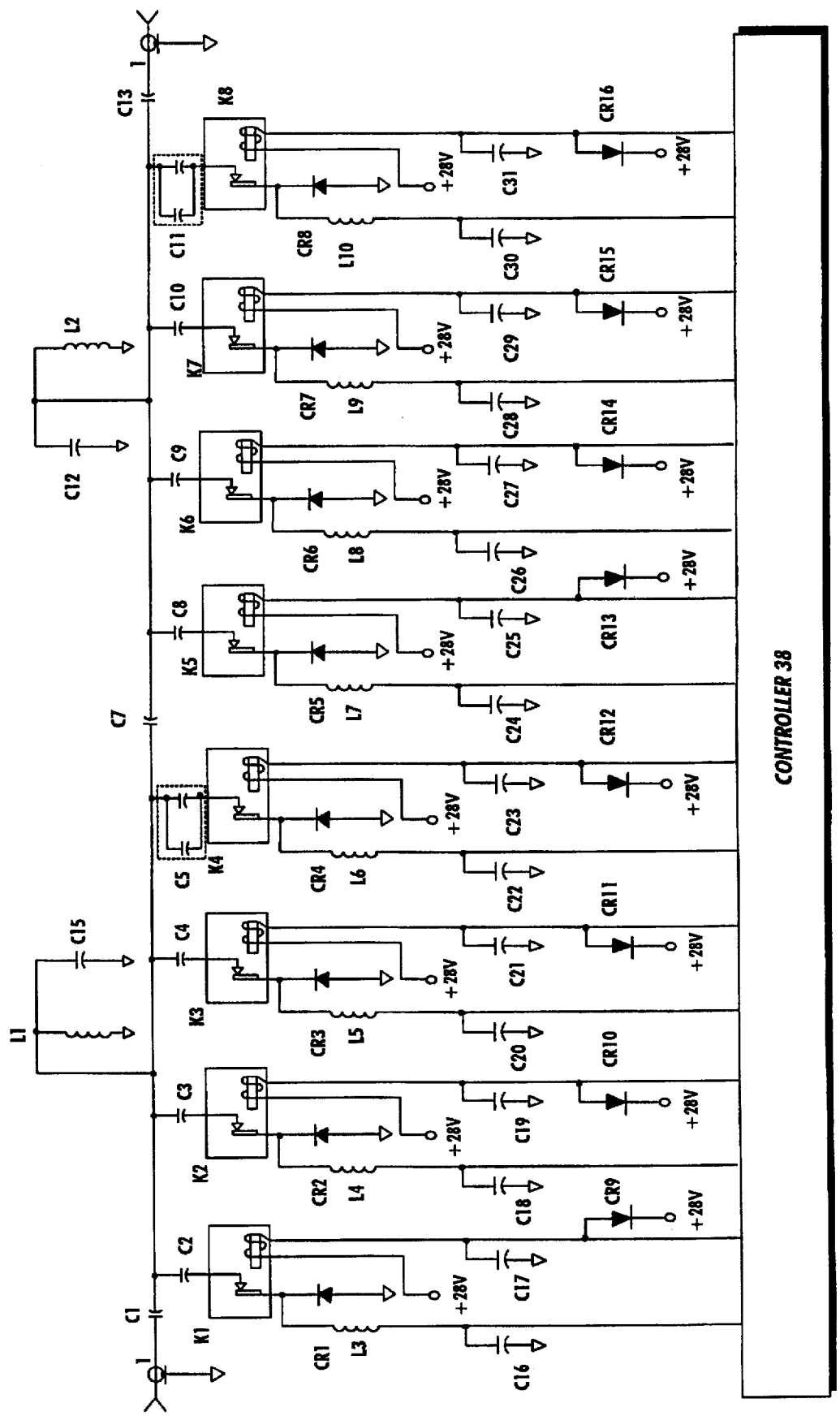
FIG. 5 is a detailed schematic diagram of a tuning circuit according to one example embodiment of the present invention.

FIG. 5 shows the tuning circuit 30 in greater detail. Like-numbered elements in FIG. 5 correspond to like-numbered elements in FIG. 3. In particular, FIG. 5 shows the connection of controller 38 to the capacitance branches to control the states of the diodes CR1–CR8 and the relays K1–K8. FIG. 5 also illustrates the diodes CR9–CR16 which suppress the back emf generated when the relay driving coils are de-energized. The back emf has the potential of damaging the controller if it goes un-suppressed. The inductors L3–L10 shut out any reactive impedance (capacitive or inductive) in the controller 38 or other circuits, which could otherwise interfere with the PIN diode operation. When the PIN diode is reversed biased, it exhibits a small value capacitance (about 2 pf) and a large resistance (over 100 KΩ). Any other parasitic reactive components would hamper proper tuning operation. The inductors L3–L10 thus shut out that possibility.

In yet another aspect of the present invention, the VSWR may be tuned to a more optimal level than described above. In particular, with a discrete number of capacitors per bank, the number of "steps" that the controller has available to tune the coil is limited. As a result, a best-possible capacitor combination will exist for tuning the coil, but may not yield an optimum VSWR condition. This will occur most frequently when a minimum number of capacitors per bank and a minimum number of banks are employed (leaving available relatively few timing "steps"). In this instance, the flip angle of the nuclei experiencing the RF power from the RF coil may be adjusted to compensate for reflected or lost RF power. This is usually, though not exclusively, done by adjusting the strength of the B1 field in known fashion.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An RF assembly for an MRI system, comprising
   a RF coil;
   RF circuits to control operation of the RF coil;
   a tuning unit, having first and second ports, connected at the first port with the RF circuits; and
   a transmission line connecting the RF coil to the second port of the tuning unit, the RF coil being remote from the tuning unit;
   wherein the tuning unit comprises:
      first and second capacitor banks each having a plurality of capacitive branches connected in parallel to each other and in parallel to an inductance, each capacitive branch comprising a capacitive element connected in series with an electro-magnetic switch and a semiconductor switch;
      a first series capacitor connected in series between the first port and the first capacitor bank;
      a second series capacitor connected in series between the first capacitor bank and the second capacitor bank; and
      a third series capacitor connected in series between the second capacitor bank and the second port.

2. An RF assembly for an MRI system according to claim 1, wherein the electro-magnetic switch is a relay.

3. An RF assembly for an MRI system according to claim 1, wherein the semiconductor switch is a PIN diode.

4. An RF assembly for an MRI system according to claim 2, wherein the electro-magnetic switch is a relay and the semiconductor switch is a PIN diode.

5. An RF assembly for an MRI system according to claim 1, wherein each bank includes four capacitive branches having four corresponding capacitive elements having differing capacitive values.

6. An RF assembly for an MRI system according to claim 1, further including,
   a controller to open and close the electro-magnetic and semiconductor switches of the capacitive branches.

7. An RF assembly for an MRI system according to claim 1, wherein
   the electro-magnetic switch has a voltage threshold less than that of the semiconductor switch for maintaining an open condition during operation of the RF coil; and
   the semiconductor switch has an open/close response time less than that of the electro-magnetic switch.

8. A method of remotely tuning a RF coil using a tuning circuit having capacitive branches each having a PIN diode, a relay and a fixed value capacitor connected in series, comprising the steps of:
   1) closing the relay in every capacitive branch;
   2) switching the PIN diodes between their open and closed states to correspondingly isolate from and apply to the tuning circuit the fixed value capacitors associated with the PIN diodes;
   3) during each switching of step 2, testing the RF coil and tuning circuit for an optimum tuned condition;
   4) memorizing the open and closed states of the PIN diodes during the optimum tuned condition found in step 3;
   5) closing all of the PIN diodes; and
   6) applying the memorized open/closed states to the corresponding relays in series with the PIN diodes.

9. A method of remotely tuning a RF coil according to claim 8, wherein the RF coil applies RF power to nuclei inducing a nuclei flip angle, the method further including the step, after step 6), of:

7) adjusting the flip angle for a more optimum tuned condition.

10. A tuning circuit for matching an MRI RF coil, comprising:

- first and second capacitor banks each having a plurality of capacitive branches connected in parallel to each other and in parallel to an inductance, each capacitive branch comprising a capacitive element connected in series with an electro-magnetic switch and a semiconductor switch;
- a first series capacitor connected in series between the first port and the first capacitor bank;
- a second series capacitor connected in series between the first capacitor bank and the second capacitor bank; and
- a third series capacitor connected in series between the second capacitor bank and the second port.

11. A tuning circuit for matching an MRI RF coil according to claim 10, wherein the electro-magnetic switch is a relay.

12. A tuning circuit for matching an MRI RF coil according to claim 10, wherein the semiconductor switch is a PIN diode.

13. A tuning circuit for matching an MRI RF coil according to claim 10, wherein the electro-magnetic switch is a relay and the semiconductor switch is a PIN diode.

14. A tuning circuit for matching an MRI RF coil according to claim 10, wherein each bank includes four capacitive branches having four corresponding capacitive elements having differing capacitive values.

15. A tuning circuit for matching an MRI RF coil according to claim 10, further including,

- a controller to open and close the electro-magnetic and semiconductor switches of the capacitive branches.

16. A tuning circuit for matching an MRI RF coil according to claim 10, wherein

- the electro-magnetic switch has a voltage threshold less than that of the semiconductor switch for maintaining an open condition during operation of the RF coil; and
- the semiconductor switch has an open/close response time less than that of the electro-magnetic switch.

* * * * *